US006514875B1

(12) United States Patent
Yu

(10) Patent No.: US 6,514,875 B1
(45) Date of Patent: *Feb. 4, 2003

(54) CHEMICAL METHOD FOR PRODUCING SMOOTH SURFACES ON SILICON WAFERS

(75) Inventor: Conrad Yu, Antioch, CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/846,196

(22) Filed: Apr. 28, 1997

(51) Int. Cl.[7] .............................................. H01L 21/302
(52) U.S. Cl. ........................ 438/745; 438/752; 438/753; 134/1.3
(58) Field of Search ................................ 438/745, 752, 438/753; 134/1.3

(56) References Cited

U.S. PATENT DOCUMENTS

| | | | | |
|---|---|---|---|---|
| 3,888,708 A | * | 6/1975 | Wise et al. ................. | 438/753 |
| 4,498,953 A | * | 2/1985 | Cook et al. ................. | 438/738 |
| 4,681,657 A | | 7/1987 | Hwang et al. .............. | 156/657 |
| 4,784,721 A | | 11/1988 | Holmes et al. ............. | 156/647 |
| 4,829,025 A | | 5/1989 | Iranmasesh ................ | 437/228 |
| 4,838,991 A | | 6/1989 | Cote et al. .................. | 156/643 |
| 4,874,463 A | | 10/1989 | Koze et al. ................. | 156/645 |
| 4,911,783 A | | 3/1990 | Voboril ....................... | 156/643 |
| 5,096,854 A | | 3/1992 | Saito et al. ................. | 437/225 |
| 5,382,296 A | * | 1/1995 | Anttila ........................ | 134/3 |
| 5,395,481 A | | 3/1995 | McCarthy ................... | 156/663 |
| 5,686,364 A | * | 11/1997 | Ohki et al. ................. | 438/745 |
| 5,885,901 A | * | 3/1999 | Gotoh et al. ............... | 438/720 |

OTHER PUBLICATIONS

Etching Roughness For (100) Silicon Surfaces In Aqueous KOH, E.D. Palik, O.J. Glembocki, Naval Research Laboratory, Washington, DC; I. Heard Jr., P.S. Burno, Lincoln University, Lincoln University, PA; L. Tenerz, Uppsala University, Uppsala, Sweden.
Temporal Evolution of Silicon Surface Roughness During Anisotropic Etching Processes, Micro Electro Mechanical Systems '92, Feb. 4–7, 1992, Findler/Mchow/Koch and Munzel, pp. 72–66.
Radiochemical Study of Semiconductor Surface Contamination, Werner Kern, RCA Laboratories, Princeton, N.J., RCA Review, Jun. 1970, pp. 207–233.

* cited by examiner

*Primary Examiner*—Benjamin L. Utech
*Assistant Examiner*—Lynette T. Umez-Eronini
(74) *Attorney, Agent, or Firm*—L. E. Carnahan; Alan H. Thompson

(57) ABSTRACT

An improved method for producing optically smooth surfaces in silicon wafers during wet chemical etching involves a pre-treatment rinse of the wafers before etching and a post-etching rinse. The pre-treatment with an organic solvent provides a well-wetted surface that ensures uniform mass transfer during etching, which results in optically smooth surfaces. The post-etching treatment with an acetic acid solution stops the etching instantly, preventing any uneven etching that leads to surface roughness. This method can be used to etch silicon surfaces to a depth of 200 μm or more, while the finished surfaces have a surface roughness of only 15–50 Å (RMS).

24 Claims, 1 Drawing Sheet

CHEMICAL METHOD FOR PRODUCING SMOOTH SURFACES ON SILICON WAFERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to a method for producing optically smooth surfaces on silicon wafers undergoing chemical etching.

2. Description of Related Art

Smooth etching of silicon using wet chemistry techniques is highly desirable for some integrated circuit applications and for manufacturing devices such as microstructures, microsensors, and electro-optic devices. Smooth etching is also advantageous to produce surfaces that will be bonded together, since stronger bonds are formed between flat silicon substrate surfaces having minimum roughness.

In micromachining, a potassium hydroxide (KOH) etchant is commonly used to etch silicon wafers anisotropically to create three-dimensional or multi-level features. This conventional KOH etching process typically produces rough surfaces. For example, the surface smoothness of manufactured prime grade wafers, typically 5–10 Å (RMS), rapidly deteriorates to 100–200 Å (RMS) after etching in potassium hydroxide (KOH) to a depth of only a few microns. Other conventional wafer thinning techniques use hydrofluoric acid (HF) and nitric acid ($HNO_3$) solutions, which are vigorous, hard to control, and are isotropic etching processes that cannot make precise rectangular geometries.

An improved processing technique that improves the microscopic smoothness of semiconductor wafers undergoing wet chemical etching that is slower and thus easier to control, and is anisotropic in nature to permit fabrication of precise rectangular features, would be advantageous. The present invention provides a process with these features.

SUMMARY OF THE INVENTION

This invention is a process for producing optically smooth surfaces on silicon wafers undergoing anisotropic etching, such as potassium hydroxide (KOH) etching. The process includes a pre-treatment surface cleaning step before etching, in which the surface is wet with an organic rinse, such as acetone or methanol. A post-etching rinse is used to stop etching instantly, which prevents uneven etching and rough surfaces. The present process can be used to etch silicon surfaces to a depth of 200 μm or more, while the finished surfaces have a surface roughness of only 15–50 Å (RMS), as compared to the 100–200 Å (RMS) usually achieved with general wet chemical etching.

This new processing technique has numerous applications besides wafer thinning. It can be used to produce a precision gap between two wafers. Because new features are possible on the smoothly etched surfaces, this new process is useful in fabricating three-dimensional or multi-level devices, such as sensors and other microstructures requiring mirror-like etched surfaces. The process can also be used to make precise wafer alignment guides for wafer bonding. The technique is excellent for size control when etched-through features have deviated sizes due to variations in wafer thickness.

DETAILED DESCRIPTION OF THE INVENTION

Figure 1:
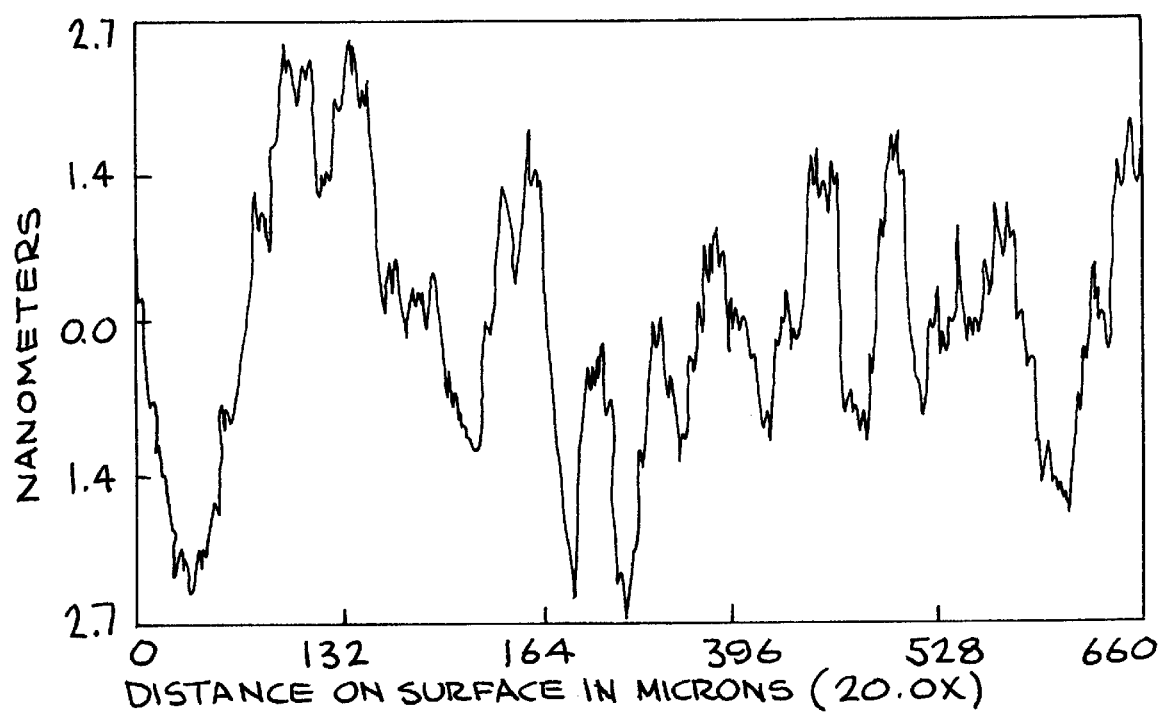
FIG. 1 shows a surface profile of a silicon wafer etched using the present method.

The present invention is a method for producing optically smooth surfaces on silicon wafers during wet chemical etching. The method involves a pretreatment cleaning of the wafers before etching and a post-etching rinse. The pretreatment provides a well-wetted surface that ensures uniform mass transfer during etching, which results in optically smooth surfaces. The post-etching treatment stops the etching instantly, preventing any uneven etching that leads to surface roughness. This method can be applied to other semiconductor materials, such as germanium and gallium arsenide, that undergo surface oxidation like silicon.

The starting wafers are typically double-side polished silicon and are prepared for etching using conventional techniques. The wafer is typically cleaned with a standard RCA cleaning procedure. A thermal oxide mask is grown on the wafer at a temperature of about 1100° C. The wafers are patterned with standard positive resist photolithography, and windows in the oxide are opened using a $HF/NH_4F$ (1:6) buffered etch solution.

In the present invention, the patterned wafers are typically dried with nitrogen gas (dry $N_2$) and then undergo a surface pre-treatment process of rinsing with an organic solvent to ensure a well-wetted surface. Rinsing with an organic compound for 1–2 minutes not only wets the surface but prevents oxidation, which is important for improving surface smoothness during etching. When an oxide is allowed to form, there is etching along the grain boundaries, producing an unsmooth surface. Thus, exposing the wafer to water should be avoided.

The preferred pre-treatment rinse is an alcohol, such as methanol or isopropanol (reagent grade). Methanol, in particular, is highly compatible with the $KOH/H_2O$ etching solution to which the wafers are next exposed. An acetone rinse may be beneficial to remove photoresist, organics, and the SiF bonds left over from the buffered solution. Alternatively, a methanol rinse may be used first, then an acetone rinse, then another methanol rinse to improve compatibility with the $KOH/H_2O$ solution. The surface pre-treatment provides a well-wetted surface that ensures uniform mass transfer for etching.

The wafers are typically anisotropically etched in a KOH solution (44 wt % at 50–90° C., with an etch rate of 0.2 to 1.2 μm/minute), and undergo the following reaction:

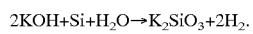

$$2KOH + Si + H_2O \rightarrow K_2SiO_3 + 2H_2.$$

After etching is complete, the etched wafers are removed from the KOH solution and immediately undergo a surface post-etching rinse. The preferred post-treatment rinse is an acetic acid solution (20–40 vol %), where the wafers are immersed for at least 30 seconds. The acetic acid reacts with the KOH as follows:

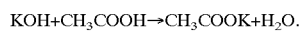

$$KOH + CH_3COOH \rightarrow CH_3COOK + H_2O.$$

This treatment stops the reaction instantaneously and prevents uneven etching. Without such a treatment, a surface layer of viscous KOH solution adheres to the wafer and continues to etch the surface, hindering the fine control desired to make microfeatures. To maximize surface smoothness, the surface layer of KOH solution adhering to the wafer must be neutralized and removed quickly. The acetic acid solution will accomplish this neutralization and removal. After this post-treatment rinse, the wafers can be rinsed in deionized water for about two minutes.

The conventional method of only rinsing the etched wafers in water is not effective in removing the KOH solution quickly and stopping the reaction. The present method represents a marked improvement in obtaining smooth surfaces and even etching. FIG. 1 shows the smoothness of a silicon wafer etched using the present method. Specifically, FIG. 1 shows a surface profile of an etched silicon wafer (100) with a surface roughness of about 50 Å, measured by interferometry.

The foregoing description of preferred embodiments of the invention is presented for purposes of illustration and description and is not intended to be exhaustive or to limit the invention to the precise form disclosed. Many modifications and variations are possible in light of the above teaching.

What is claimed is:

1. A method for producing optically smooth surfaces on semiconductor wafers undergoing anisotropic etching, comprising:
   preparing a patterned semiconductor wafer;
   treating the wafer by rinsing with an organic solvent;
   etching the patterned wafer with an anisotropic etchant solution; and
   rinsing the wafer with an acetic acid solution immediately after etching to stop further etching and prevent uneven etching.

2. The method as recited in claim 1, wherein the semiconductor wafer comprises a material selected from the group consisting of silicon, germanium, and gallium arsenide.

3. The method as recited in claim 1, wherein the organic solvent comprises an alcohol.

4. The method as recited in claim 3, wherein the organic solvent is selected from the group consisting of methanol and isopropanol.

5. The method as recited in claim 1, wherein the organic solvent comprises acetone.

6. A method as recited in claim 1, wherein treating the wafer further comprises rinsing the wafer with an acetone rinse after rinsing with the solvent.

7. A method as recited in claim 6, wherein treating the wafer further comprises rinsing the wafer with methanol after the acetone rinse.

8. A method as recited in claim 1, further comprising drying the wafer with nitrogen gas before treating the wafer.

9. A method as recited in claim 1, wherein the etchant solution comprises a potassium hydroxide solution.

10. A method as recited in claim 1, wherein the acetic acid solution comprises about 20–40% acetic acid by volume.

11. A method for producing an optically smooth surface on a semiconductor wafer undergoing anisotropic etching, comprising:
    preparing a patterned semiconductor wafer;
    rinsing the wafer with an organic solvent to wet the surface;
    etching the surface of the patterned wafer with an anisotropic etchant solution; and
    stopping the etching and preventing uneven etching by rinsing with an acetic acid solution immediately after etching.

12. The method as recited in claim 11, wherein the organic solvent comprises an alcohol.

13. The method as recited in claim 12, wherein the organic solvent is selected from the group consisting of methanol and isopropanol.

14. The method as recited in claim 11, wherein the organic solvent comprises acetone.

15. A method as recited in claim 11, further comprising rinsing the wafer with an acetone rinse after rinsing with the organic solvent.

16. A method as recited in claim 15, further comprising rinsing the wafer with methanol after the acetone rinse.

17. A method as recited in claim 11, wherein the acetic acid solution comprises about 20–40% acetic acid by volume.

18. A method as recited in claim 11, wherein stopping the etching is carried out immediately after etching such that the surface has a roughness of less than about 50 Å.

19. In a method for producing an optically smooth surface on a patterned semiconductor wafer undergoing anisotropic etching, the improvement comprising:
    treating the patterned wafer by rinsing with an organic solvent prior to etching the patterned wafer with an anisotropic etchant solution, and
    instantaneously stopping the etching and preventing uneven etching by rinsing with an acetic acid solution.

20. The improvement of claim 19, wherein the treating is carried out using a methanol rinse followed by an acetone rinse followed by another methanol rinse to improve compatibility with the anisotropic etchant solution.

21. The improvement of claim 19, wherein the treating is carried out using rinsing with at least one of alcohol and acetone.

22. The improvement of claim 21, wherein the alcohol rinse is carried out by material selected from the group consisting of methanol and isopropanol.

23. The improvement of claim 19, wherein the rinsing with an acetic acid solution is carried out by immersing the wafer in a 20–40 vol % solution for a time period of at least 30 seconds.

24. The improvement of claim 19, wherein the treating and the stopping of the etching is carried out to enable an etch depth of at least 200 μm and with a finished surface roughness of about 15–50 Å (RMS).

* * * * *